(12) United States Patent
Li et al.

(10) Patent No.: US 10,559,463 B2
(45) Date of Patent: Feb. 11, 2020

(54) MULTI-STATE DEVICE BASED ON ION TRAPPING

(71) Applicant: International Business Machines Corporation, Armonk, NY (US)

(72) Inventors: Ning Li, White Plains, NY (US); Yun Seog Lee, Seoul (KR); Joel P. de Souza, Putnam Valley, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/828,007

(22) Filed: Nov. 30, 2017

(65) Prior Publication Data

US 2019/0164750 A1 May 30, 2019

(51) Int. Cl.
*H01L 21/02* (2006.01)
*H01L 23/58* (2006.01)
(Continued)

(52) U.S. Cl.
CPC .. *H01L 21/02362* (2013.01); *H01L 21/02178* (2013.01); *H01L 21/02304* (2013.01);
(Continued)

(58) Field of Classification Search
CPC ......... H01L 51/5016; H01L 2251/5338; H01L 51/0097; H01L 51/56
(Continued)

(56) References Cited

U.S. PATENT DOCUMENTS

| | | | |
|---|---|---|---|
| 2008/0032236 A1* | 2/2008 | Wallace | H01M 6/40 430/319 |
| 2009/0289290 A1* | 11/2009 | Huang | G11C 11/5614 257/300 |
| 2013/0181298 A1 | 7/2013 | Shifren et al. | |

FOREIGN PATENT DOCUMENTS

| | | |
|---|---|---|
| CN | 107068708 A | 8/2017 |
| WO | 2008/072147 A1 | 6/2008 |

OTHER PUBLICATIONS

Xu et al., Lithium transport through lithium-ion battery cathode coatings, Journal of Material Chemistry A, Accepted Jul. 5, 2015, pp. 17248-17272, 3.

(Continued)

*Primary Examiner* — Andy Huynh
(74) *Attorney, Agent, or Firm* — Scully, Scott, Murphy & Presser, P.C.; L. Jeffrey Kelly, Esq.

(57) ABSTRACT

A semiconductor structure is provided that contains a non-volatile battery which controls gate bias and has increased output voltage retention and voltage resolution. The semiconductor structure may include a semiconductor substrate including at least one channel region that is positioned between source/drain regions. A gate dielectric material is located on the channel region of the semiconductor substrate. A battery stack is located on the gate dielectric material. The battery stack includes, a cathode current collector located on the gate dielectric material, a cathode material located on the cathode current collector, a first ion diffusion barrier material located on the cathode material, an electrolyte located on the first ion diffusion barrier material, a second ion diffusion barrier material located on the electrolyte, an anode region located on the second ion diffusion barrier material, and an anode current collector located on the anode region.

13 Claims, 1 Drawing Sheet

(51) Int. Cl.
*H01M 4/04* (2006.01)
*H01L 21/768* (2006.01)
*H01L 21/225* (2006.01)
*G11C 5/14* (2006.01)
*H01L 21/223* (2006.01)
*H01L 21/762* (2006.01)

(52) U.S. Cl.
CPC .... *H01L 21/2258* (2013.01); *H01L 21/76846* (2013.01); *H01L 23/58* (2013.01); *H01M 4/0426* (2013.01); *G11C 5/141* (2013.01); *H01L 21/2233* (2013.01); *H01L 21/7624* (2013.01); *H01L 21/76859* (2013.01); *H01M 2300/0068* (2013.01)

(58) Field of Classification Search
USPC ........................................................ 257/734
See application file for complete search history.

(56) References Cited

OTHER PUBLICATIONS

International Search Report dated Jan. 29, 2019, received in International Application No. PCT/IB2018/059035.

* cited by examiner

MULTI-STATE DEVICE BASED ON ION TRAPPING

BACKGROUND

The present application relates to semiconductor technology. More particularly, the present application relates to a semiconductor structure that contains a non-volatile battery which controls gate bias, which structure may be used in neuromorphic computing.

Neuromorphic technology aims to mimic the neural network architecture of a human brain. The origins of the technology date back to the late 1980s. In recent years, there has been renewed interest in neuromorphic engineering. The foundational premise of the brain-like chip is to replicate the morphology of individual neurons and to build artificial neural systems. The ultimate goal is to create a computer which replicates some of the fundamental characteristics of the human brain.

While the neuroscientific study of the human brain is nowhere near finalized, work is ongoing to realize the brain-computer analogy. Although neuroscience has yet to grasp fully all the intricacies of the human brain, neuromorphic engineers are aiming to design a computer which presents three of the characteristics of the brain that are known to date: lower power consumption (human brains use less energy but are nevertheless immensely complex), fault intolerance (brains lose neurons and are still able to function, whereas microprocessors can be affected by the loss of one transistor) and no need to be programmed (unlike computers, brains are able to learn and respond spontaneously to signals from the environment).

Advances in neuromorphic computing are thus needed in order to design a computer that has the characteristics of a human brain.

SUMMARY

A semiconductor structure is provided that contains a non-volatile battery which controls gate bias. The non-volatile battery has improved output voltage retention and an increased voltage resolution and thus the structure may be used in neuromorphic computing. By "non-volatile battery" it is meant a multi-state analog memory device that is based on a battery like structure.

In one aspect of the present application, a semiconductor structure is provided. In one embodiment, the semiconductor structure may include a semiconductor substrate including at least one channel region that is positioned between source/drain regions. A gate dielectric material is located on the channel region of the semiconductor substrate. A battery stack is located on the gate dielectric material. In accordance with the present application, the battery stack includes a cathode current collector located on the gate dielectric material, a cathode material located on the cathode current collector, a first ion diffusion barrier material located on the cathode material, an electrolyte located on the first ion diffusion barrier material, a second ion diffusion barrier material located on the electrolyte, an anode region located on the second ion diffusion barrier material, and an anode current collector located on the anode region.

In another aspect of the present application, a method of forming a semiconductor structure is provided. In one embodiment, the method may include providing a material stack of a gate dielectric material and a battery stack on a surface of a semiconductor substrate. The battery stack includes a cathode current collector located on the gate dielectric material, a cathode material located on the cathode current collector, a first ion diffusion barrier material located on the cathode material, an electrolyte located on the first ion diffusion barrier material, a second ion diffusion barrier located on the electrolyte, and an anode current collector located atop the second ion diffusion barrier material. Source/drain regions can be formed into the semiconductor substrate and on opposite side of the material stack. The source/drain regions can be formed prior to, or after, formation of the material stack.

In some embodiments, an anode region is deposited on the second ion diffusion barrier material prior to forming the anode current collector. In other embodiments, an anode region is formed between the second ion diffusion barrier material and the anode current collector during a charging/recharging process that is performed after battery stack formation.

DETAILED DESCRIPTION

Figure 1:
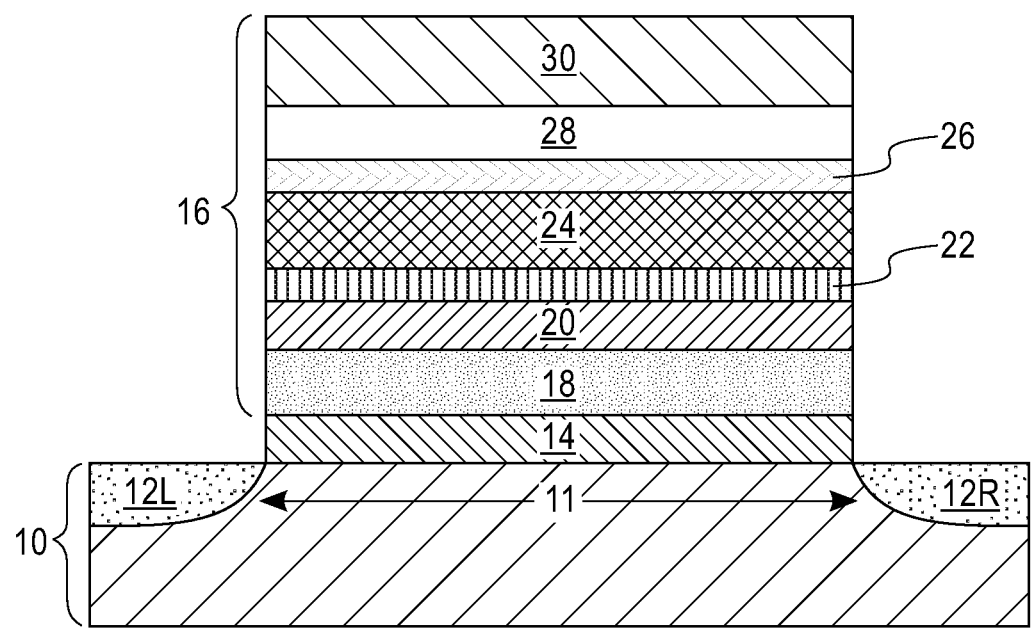
FIG. 1 is a cross sectional view of an exemplary semiconductor structure in accordance with the present application including a material stack of a gate dielectric material and a battery stack that is located on a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure in accordance with the present application. The exemplary semiconductor structure shown in FIG. 1 includes a material stack of a gate dielectric material 14 and a battery stack 16 that is located on a semiconductor substrate 10. In some embodiments (and as shown), the gate dielectric material 14 has sidewall edges that are vertically aligned to the sidewall edges of the battery stack 16.

The material stack (14/16) is located between source/drain regions 12L, 12R that are formed into the semiconductor substrate 10. In some embodiments, a portion of the material stack (14/16) may extend above each of the source/drain regions 12L, 12R. Although the present application describes and illustrates a single material stack (14/16), the present application contemplates embodiments in which a plurality of material stacks (14/16) are formed on the semiconductor substrate 10, wherein each material stack of the plurality material stacks (14/16) is located between other source/drain regions that are present in the semiconductor substrate 10.

In one embodiment of the present application, source/drain region 12L may be a source region, while source/drain region 12R may be a drain region. In yet another embodiment of the present application, source/drain region 12L may be a drain region, while source/drain region 12R may be a source region. The region of the semiconductor substrate 10 that is located between the source/drain regions 12L, 12R and beneath the material stack (14/16) may be referred to herein as a channel region 11.

The semiconductor substrate 10 that can be employed in the present application is composed of at least one semiconductor material. The term "semiconductor material" is used throughout the present application to denote a material having semiconducting properties. Examples of semiconductor materials that may be employed as the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the semiconductor material that may provide the semiconductor substrate 10 is a bulk semiconductor substrate. By "bulk" it is meant that the semiconductor substrate 10 is entirely composed of at least one semiconductor material, as defined above. In one example, the semiconductor substrate 10 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

In another embodiment, semiconductor substrate 10 is composed of a topmost semiconductor material layer of a semiconductor-on-insulator (SOI) substrate. The SOI substrate would also include a handle substrate (not shown) including one of the above mentioned semiconductor materials, and an insulator layer (not shown) such as a buried oxide below the topmost semiconductor material layer.

In yet another embodiment, the semiconductor structure 10 is composed of a topmost semiconductor material layer and a dielectric material (not shown) such as, for example, silicon dioxide.

In any of the embodiments mentioned above, the semiconductor material that may provide the semiconductor substrate 10 may be a single crystalline semiconductor material. The semiconductor material that may provide the semiconductor substrate 10 may have any of the well known crystal orientations. For example, the crystal orientation of the semiconductor material that may provide semiconductor substrate 10 may be {100}, {110}, or {111}. Other crystallographic orientations besides those specifically mentioned can also be used in the present application.

The semiconductor substrate 10 that can be used in the present application can have a thickness from 10 µm to 5 mm. Other thicknesses that are lesser than, or greater than, the aforementioned thickness values may also be used for semiconductor substrate 10.

The source/drain regions 12L, 12R are present in an upper semiconductor material portion of the semiconductor substrate 10 and located on opposite sides of the material stack (14/16). The source/drain regions 12L, 12R include a p-type or n-type dopant.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The term "n-type dopant" refers to the addition of impurities that contributes free electrons to an intrinsic semiconductor. In a silicon containing semiconductor material, examples of n-type dopants, i.e., impurities, include, but are not limited to, antimony, arsenic and phosphorous. The source/drain regions 12L, 12R have a dopant concentration (p- or n-type) that is within ranges well known to those skilled in the art. In one example, the source/drain regions 12L, 12R have a dopant concentration that is from 1E18 atoms/cm$^3$ to 1E20 atoms/cm$^3$.

The gate dielectric material 14 of the material stack (14/16) may include a dielectric oxide, nitride, and/or oxynitride. In one example, the gate dielectric material 14 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure composed of different gate dielectric materials, e.g., silicon dioxide, and a high-k gate dielectric, can be formed and used as the gate dielectric material 14.

The gate dielectric material 14 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 14 can have a thickness in a range from 1 nm to 10 nm. Other thicknesses that are lesser than, or greater than, the aforementioned thickness range can also be employed for the gate dielectric material 14.

The battery material stack 16 that is formed on the gate dielectric material 14 may include, from bottom to top, a cathode current collector 18, a cathode material 20, a first ion diffusion barrier material 22, an electrolyte 24, a second ion diffusion barrier material 26, an anode region 28, and an anode current collector 30. The cathode current collector 18, the cathode material 20, the first ion diffusion barrier material 22, the electrolyte 24, the second ion diffusion barrier material 26, the anode region 28, and the anode current collector 30 are stacked one atop the other. The anode region 28 may be a deposited anode material or it may be an accumulation region that forms during a charging/recharging process.

The cathode current collector 18 may include any metallic electrode material such as, for example, titanium (Ti), platinum (Pt), nickel (Ni), copper (Cu) and titanium nitride (TiN). In one example, cathode current collector 18 includes a stack of, from bottom to top, titanium (Ti), platinum (Pt) and titanium (Ti). The cathode current collector electrode 18 may be formed utilizing a deposition process including, for example, chemical vapor deposition (CVD), plasma enhanced chemical vapor deposition (PECVD), evaporation, sputtering, or plating. The cathode current collector electrode 18 may have a thickness from 5 nm to 20 nm. Other thicknesses that are lesser than, or greater than, the aforementioned thickness values may also be used for the cathode current collector 18.

The cathode material 20 may be composed of any material that is employed in a battery. In one embodiment, the cathode material 20 is composed of a lithiated material such as, for example, a lithium-based mixed oxide. Examples of lithium-based mixed oxides that may be employed as include, but are not limited to, lithium cobalt oxide ($LiCoO_2$), lithium nickel oxide ($LiNiO_2$), lithium manganese oxide ($LiMn_2O_4$), lithium cobalt manganese oxide ($LiCoMnO_4$), a lithium nickel manganese cobalt oxide ($LiNi_xMn_yCo_zO_2$), lithium vanadium pentoxide ($LiV_2O_5$) or lithium iron phosphate ($LiFePO_4$).

The cathode material 20 may be formed utilizing a sputtering process. In one embodiment, sputtering may include the use of any precursor source material or combination of precursor source materials. In one example, a lithium precursor source material and a cobalt precursor source material are employed in forming a lithium cobalt mixed oxide. Sputtering may be performed in an admixture of an inert gas and oxygen. In such an embodiment, the oxygen content of the inert gas/oxygen admixture can be from 0.1 atomic percent to 70 atomic percent, the remainder of the admixture includes the inert gas. Examples of inert gases that may be used include argon, helium, neon, nitrogen or any combination thereof.

The cathode material 20 may have a thickness from 20 nm to 200 nm. Other thicknesses that are lesser than, or greater than, the aforementioned thickness values may also be used for the cathode material 20. Thick cathode materials 20 can provide enhanced battery capacity since there is more area, i.e., volume, to store the battery charge.

The first ion diffusion barrier material 22 is composed of a material that has a low ion diffusivity. By "low ion diffusivity" it is meant an ion diffusivity of 1E–6 $cm^2$/sec or less. In one example, and for lithium ions, the diffusivity of the first ion diffusion barrier material 22 is from 1E–13 $cm^2$/sec to 1E–10 $cm^2$/sec. Illustrative examples of materials that have a low ion diffusivity include, but are not limited to, silicon dioxide, aluminum oxide, aluminum fluoride, or magnesium oxide. In one embodiment, the first ion diffusion barrier material 22 may be composed of a single material having a low ion diffusivity. In another embodiment, the first ion diffusion barrier material 22 may be composed of a multilayered stack of low ion diffusivity materials.

The first ion diffusion barrier material 22 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the first ion diffusion barrier material 22 can have a thickness in a range from 1 nm to 10 nm. Other thicknesses that are lesser than, or greater than, the aforementioned thickness range can also be employed for the first ion diffusion barrier material 22.

The electrolyte 24 may include any conventional electrolyte material. The electrolyte 24 may be a liquid electrolyte, a solid-state electrolyte or a gel type electrolyte. In some embodiments, a solid-state electrolyte may be employed that is composed of a polymer based material or an inorganic material. In other embodiments, a solid-state electrolyte may be employed that includes a material that enables the conduction of lithium ions. Such materials may be electrically insulating, but ionic conducting. Examples of materials that can be employed as a solid-state electrolyte include, but are not limited to, lithium phosphorus oxynitride (LiPON) or lithium phosphosilicate oxynitride (LiSiPON).

In embodiments in which a solid-state electrolyte layer is employed, the solid-state electrolyte may be formed utilizing a deposition process such as, sputtering, solution deposition or plating. In one embodiment, the solid-state electrolyte is formed by sputtering utilizing any conventional precursor source material. Sputtering may be performed in the presence of at least a nitrogen-containing ambient. Examples of nitrogen-containing ambients that can be employed include, but are not limited to, $N_2$, $NH_3$, $NH_4$, NO, or $NH_x$ wherein x is between 0 and 1. Mixtures of the aforementioned nitrogen-containing ambients can also be employed. In some embodiments, the nitrogen-containing ambient is used neat, i.e., non-diluted. In other embodiments, the nitrogen-containing ambient can be diluted with an inert gas such as, for example, helium (He), neon (Ne), argon (Ar) and mixtures thereof. The content of nitrogen ($N_2$) within the nitrogen-containing ambient employed is typically from 10% to 100%, with a nitrogen content within the ambient from 50% to 100% being more typical.

The separator which is used in cases in which a liquid electrolyte is used, may include one or more of a flexible porous material, a gel, or a sheet that is composed of cellulose, cellophane, polyvinyl acetate (PVA), PVA/cellulous blends, polyethylene (PE), polypropylene (PP) or a mixture of PE and PP. The separator may also be composed of inorganic insulating nano/microparticles. The separator would be positioned somewhere within electrolyte 24 to provide an upper electrolyte region and a lower electrolyte region.

The electrolyte 24 may have a thickness from 3 nm to 500 nm. Other thicknesses that are lesser than, or greater than, the aforementioned thickness range can also be employed for the electrolyte 24.

The second ion diffusion barrier material 26 is also composed of a material that has a low ion diffusivity, as defined above. In one example, and for lithium ions, the diffusivity of the second ion diffusion barrier material 26 is from 1E–12 $cm^2$/sec to 1E–7 $cm^2$/sec. Illustrative examples of materials that have a low ion diffusivity include, but are not limited to, silicon dioxide, aluminum oxide, aluminum fluoride, or magnesium oxide. The second ion diffusion barrier material 26 may be composed of a same, or different, material as the first ion diffusion barrier material 22. In one embodiment, the second ion diffusion barrier material 26 may be composed of a single material having a low ion diffusivity. In another embodiment, the second ion diffusion barrier material 26 may be composed of a multilayered stack of low ion diffusivity materials.

The second ion diffusion barrier material 26 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the second ion diffusion barrier material 26 can have a thickness in a range from 1 nm to 10 nm. Other thicknesses that are lesser than, or greater than, the aforementioned thickness range can also be employed for the second ion diffusion barrier material 26.

The anode region 28 may include any conventional anode material that is found in a battery. In some embodiments, the anode region 19 is composed of a lithium metal, a lithium-base alloy such as, for example, $Li_xSi$, or a lithium-based mixed oxide such as, for example, lithium titanium oxide ($Li_2TiO_3$). The anode region 28 may also be composed of silicon, copper, graphite, or amorphous carbon.

In some embodiments, the anode region 28 is formed prior to performing a charging/recharging process. In such an embodiment, the anode region 28 can be formed utilizing a deposition process such as, for example, chemical vapor deposition (CVD), plasma enhanced chemical vapor deposition (PECVD), evaporation, sputtering or plating. In some embodiments, the anode region 28 is a lithium accumulation region that is formed during a subsequently performed charging/recharging process which is performed after the formation of the semiconductor structure of the present application. The lithium accumulation region can be a continuous region or a discontinuous region.

The anode current collector 30 (anode-side electrode) may include any metallic electrode material such as, for example, titanium (Ti), platinum (Pt), nickel (Ni), copper (Cu) or titanium nitride (TiN). In one example, the anode current collector 30 includes a stack of, from bottom to top, nickel (Ni) and copper (Cu). The anode current collector 30 may be formed utilizing a deposition process such as, for example, chemical vapor deposition (CVD), sputtering or plating. The anode current collector 30 may have a thickness from 20 nm to 200 nm.

The semiconductor structure that is shown in FIG. 1 can be formed by first providing a semiconductor substrate 10. In some embodiments, the source/drain regions 12L, 12R can be formed at this point of the present application. In such an embodiment, a sacrificial gate structure can be formed over the channel region 11 and thereafter the source/drain regions 12L, 12R can be formed by conventional techniques such as, for example, ion implantation or gas phase doping. After forming the source/drain regions 12L, 12R, the sacrificial gate structure is removed and then material layers of the gate dielectric material 14, the cathode current collector 18, the cathode material 20, the first ion diffusion barrier material 22, the electrolyte 24, the second ion diffusion barrier material 26, optionally the anode region 28, and the anode current collector 30 are formed continuously on the semiconductor substrate 10 utilizing one of the techniques mentioned above for each of the material layers; the anode region 28 can be formed later during a subsequently performed charging/recharging process. A patterning process can then be used to pattern each of the material layers providing the material stack (14/16) shown in FIG. 1. In one embodiment, the patterning process may include lithography and etching. The etching step may include one or more anisotropic etching processes.

In some embodiments, the structure shown in FIG. 1 can be formed by first providing a semiconductor substrate 10. Material layers of the gate dielectric material 14, the cathode current collector 18, the cathode material 20, the first ion diffusion barrier material 22, the electrolyte 24, the second ion diffusion barrier material 26, optionally the anode region 28, and the anode current collector 30 are formed continuously on the semiconductor substrate 10 utilizing one of the techniques mentioned above for each of the material layers; the anode region 28 can be formed during a subsequently performed charging/recharging process. A patterning process can then be used to pattern each of the material layers providing the material stack (14/16) shown in FIG. 1. In one embodiment, the patterning process may include lithography and etching. The etching step may include one or more anisotropic etching processes. In some embodiments, the source/drain regions 12L, 12R can be formed at this point of the present application using the material stack (14/16) as an implantation mask. In such an embodiment, the source/drain regions 12L, 12R can be formed by conventional techniques such as, for example, ion implantation or gas phase doping.

In some embodiments of the present application, a lift-off method may be used in providing the material stack (14/16) shown in FIG. 1. When employed, the lift-off process includes forming a patterned sacrificial material on the semiconductor substrate 10. Next, the various layers of the material stack (14/16) are formed; the anode region can be formed prior to or after lift-off. Then, a lift-off process is performed to remove the patterned sacrificial material and materials formed on the patterned sacrificial material from the semiconductor substrate. In some embodiments, the gate dielectric material 12 is formed first and then the patterned sacrificial material layer is formed, followed by the various layers of the battery stack 16 and lift-off is thereafter performed. The source/drain regions 12L, 13R can be formed prior to, or after performing the lift-off process.

Notwithstanding the method used to form the material stack (14/16), the material stack (14/16) may have a height from 30 nm to 800 nm, and a width from 10 nm to 10,000 nm. Other widths and heights are possible for the material stack (14/16).

Figure 2:
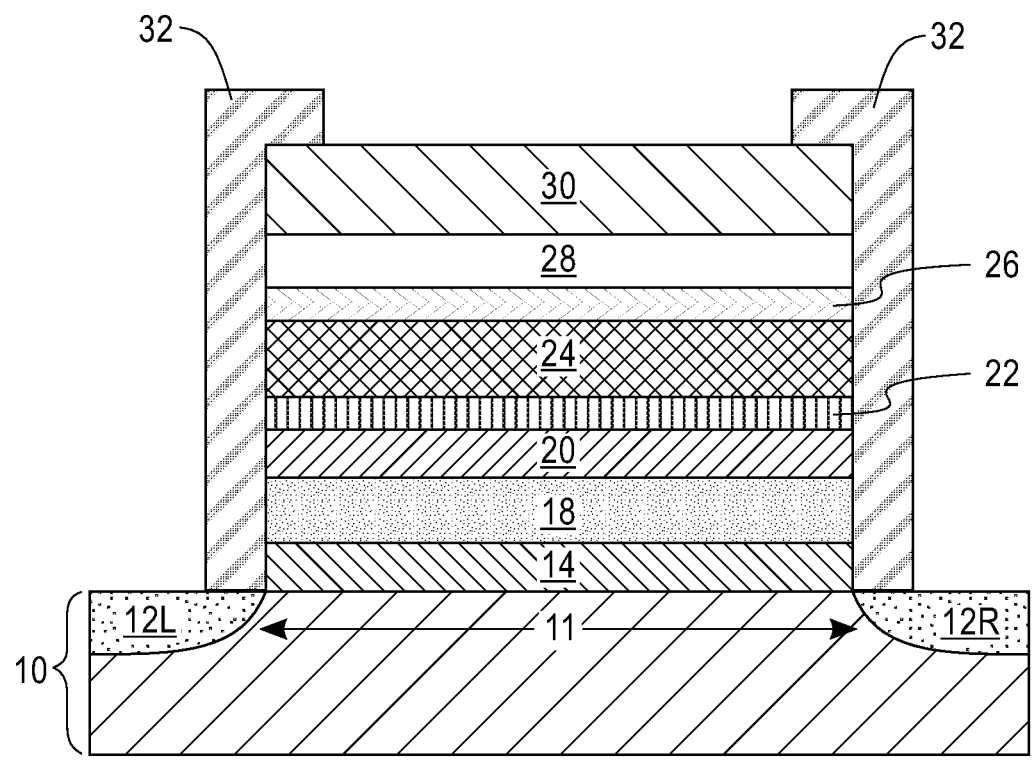
FIG. 2 is a cross sectional view of the exemplary semiconductor structure shown in FIG. 1 after spacer formation.

In some embodiments and as shown in FIG. 2, a spacer 32 can be formed along at least the sidewalls of the material stack (12/14) shown in FIG. 1. In some embodiments, the spacer 32 may extend above the topmost surface of the battery stack 16. The spacer 32 may be composed of any air and/or moisture impermeable material or multilayered stack of such materials. Examples of air and/or moisture impermeable materials that can be employed in the present application include, but are not limited to, parylene, a fluoropolymer, silicon nitride, and/or silicon dioxide. Spacer 32 may be formed by first depositing the air and/or moisture impermeable material and thereafter patterning the air and/or moisture impermeable material. In one embodiment, patterning may be performed by lithography and etching.

The battery stack 16 shown in FIG. 1 or 2 may be subjected to charging/recharging. The charge/recharge method may be performed utilizing conventional charging techniques well known to those skilled in the art. For example, the charge/recharge method may be performed by connecting the battery stack 16 to an external power supply and supply current or a voltage to the battery. In such charging/recharging method, a constant current is used until a maximum voltage is reached.

The non-volatile battery of the present application that is composed of battery stack 16 has improved output voltage retention and an increased voltage resolution and thus the structure may be used in neuromorphic computing. The improved output voltage retention and increased voltage resolution is compared to a battery stack that does not contain the first and second ion diffusion barrier materials 22, 26, yet contains the other components (i.e., the cathode current collector 18, the cathode material 20, the electrolyte 24, the anode region 28, and the anode current collector 30) of the battery stack 16.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a semiconductor substrate including at least one channel region that is positioned between source/drain regions;
a gate dielectric material located on the channel region of the semiconductor substrate; and
a battery stack located on the gate dielectric material, wherein the battery stack comprises a cathode current collector located on the gate dielectric material, a cathode material located on the cathode current collector, a first ion diffusion barrier material located directly on the cathode material, an electrolyte located directly on the first ion diffusion barrier material, a second ion diffusion barrier material located directly on the electrolyte, an anode region located directly on the second ion diffusion barrier material, and an anode current collector located on the anode region.

2. The semiconductor structure of claim 1, wherein the gate dielectric material has sidewall edges that are vertically aligned to the sidewall edges of the battery stack.

3. The semiconductor structure of claim 1, wherein the first and second ion diffusion barrier materials have an ion diffusivity of less than $1E-6$ cm$^2$/s.

4. The semiconductor structure of claim 3, wherein the first and second ion diffusion barrier materials comprise silicon dioxide, aluminum oxide, aluminum fluoride, magnesium oxide or a multilayered stack thereof.

5. The semiconductor structure of claim 3, wherein the first and second ion diffusion barrier materials are entirely composed of aluminum oxide ($Al_2O_3$).

6. The semiconductor structure of claim 1, wherein the semiconductor substrate is a bulk semiconductor substrate.

7. The semiconductor structure of claim 1, wherein the semiconductor substrate is a topmost semiconductor material layer of a semiconductor-on-insulator substrate.

8. The semiconductor structure of claim 1, wherein a portion of the gate dielectric material and the battery stack extends above the source/drain regions.

9. The semiconductor structure of claim 1, wherein the gate dielectric material comprises a high k gate dielectric material.

10. The semiconductor structure of claim 9, wherein the high k gate dielectric material comprises $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, or an alloy thereof, wherein value of x is independently from 0.5 to 3 and each value of y is independently from 0 to 2.

11. The semiconductor structure of claim 1, wherein the cathode material is a lithiated material.

12. The semiconductor structure of claim 1, wherein the electrolyte comprises a solid-state electrolyte, a liquid type electrolyte, or a gel type electrolyte.

13. The semiconductor structure of claim 1, wherein the battery stack is non-volatile.

* * * * *